United States Patent [19]

Adler

[11] 4,087,300

[45] May 2, 1978

[54] PROCESS FOR PRODUCING METAL-PLASTIC LAMINATE

[76] Inventor: Edward Adler, 266 Arch Rd., Englewood, N.J. 07631

[21] Appl. No.: 596,360

[22] Filed: Jul. 16, 1975

Related U.S. Application Data

[63] Continuation of Ser. No. 431,500, Jan. 7, 1974, abandoned.

[51] Int. Cl.² .................... B32B 15/08; B32B 31/20
[52] U.S. Cl. ........................ 156/184; 156/192; 156/289; 156/309; 156/312; 156/324
[58] Field of Search ............. 156/184, 192, 199, 291, 156/306, 309, 312, 321, 381, 311, 324, 630, 289; 29/625

[56] References Cited

U.S. PATENT DOCUMENTS

| | | |
|---|---|---|
| 2,991,217 | 7/1961 | Schmidt et al. ............ 156/283 |
| 2,992,953 | 7/1961 | Talburtt .................... 156/104 |
| 3,362,861 | 1/1968 | Barker et al. .............. 156/306 |
| 3,454,445 | 7/1969 | Durst et al. ............... 156/306 |
| 3,505,141 | 4/1970 | Sorensen et al. .......... 156/311 |
| 3,505,159 | 4/1970 | Winter ...................... 156/229 |
| 3,616,198 | 10/1971 | Saito ........................ 156/306 |
| 3,647,617 | 3/1972 | Rieke et al. ............... 156/312 |
| 3,660,199 | 5/1972 | Riccitiello ................. 156/312 |
| 3,711,365 | 1/1973 | Pyle ......................... 156/306 |
| 3,721,597 | 3/1973 | Colburn .................... 156/309 |
| 3,767,500 | 10/1973 | Tally et al. ................ 156/184 |
| 3,809,591 | 5/1974 | Vogelfanger et al. ...... 156/306 |
| 3,930,041 | 12/1975 | Komatsu et al. .......... 156/312 |
| 3,960,635 | 6/1976 | LaRoy et al. ............. 156/312 |

OTHER PUBLICATIONS

"Adhesive Bonding of Reinforced Plastics", Perry, 1959, pp. 177-178.

Primary Examiner—William A. Powell
Attorney, Agent, or Firm—McAulay, Fields, Fisher & Goldstein

[57] ABSTRACT

At least one conductive metal foil is preliminarily bonded to an electrically insulating resinous substrate by squeezing the layers together under heat and pressure in a continuous mode, as by passing the layers through a nip roll to produce a partially cured resinous layer subjacent to the metal foil. The thus preliminarily bonded laminate is further processed in an autoclave, under heat and pressure, whereby the bonding layer between the metal and the substrate is cured. The laminate formed by this process is useful for metal-clad boards, particularly printed circuit boards. These boards may be either flexible or rigid.

19 Claims, 4 Drawing Figures

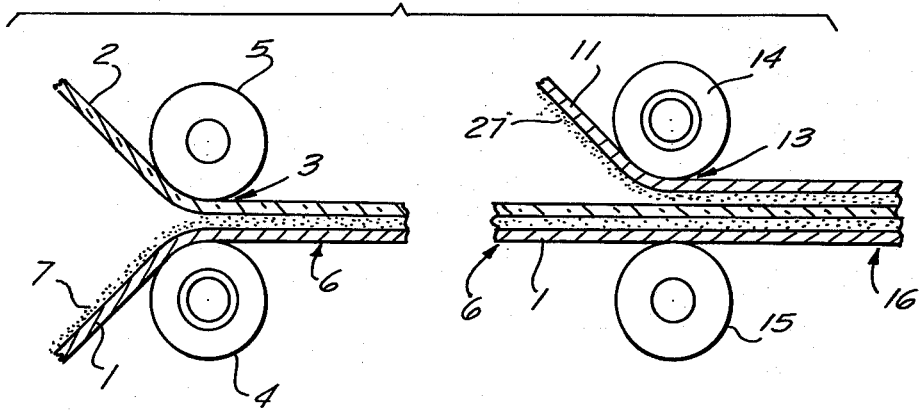
FIG. 1
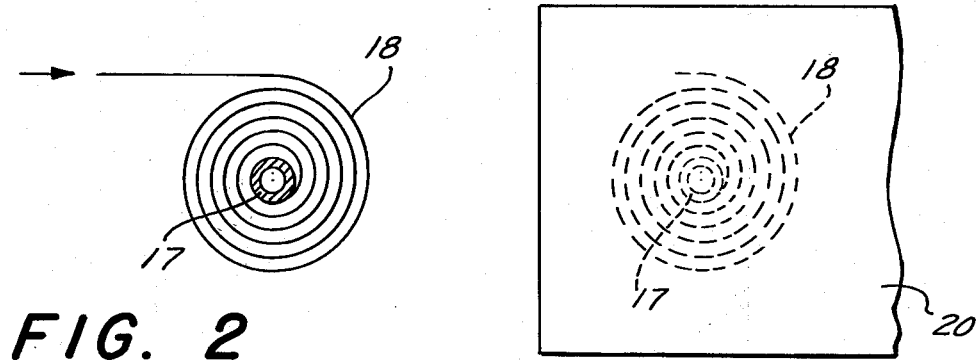
FIG. 2
FIG. 3
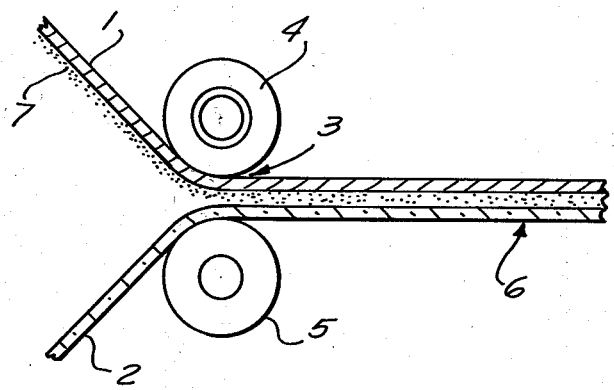
FIG. 4

PROCESS FOR PRODUCING METAL-PLASTIC LAMINATE

CROSS-REFERENCE TO RELATED APPLICATION

This application is a continuation of my co-pending application Ser. No. 431,500, filed Jan. 7, 1974, now abandoned, for "PROCESS FOR PRODUCING METAL-PLASTIC LAMINATE."

BACKGROUND OF THE INVENTION

Metal-clad boards, particularly such boards for use in fabricating printed circuits, are well known in the art. Such metal clad boards generally comprise a resinous plastic substrate to which is bonded at least one thin sheet of an electrically conductive material. Particularly, the electrically conductive material is a metal foil formed of such materials as copper, aluminum, stainless steel and the like. The resinous plastic substrate can be clad with metal foil on one or both sides, depending upon its desired use. Metal-clad boards may be either rigid or flexible depending upon the composition of the resinous plastic substrate and the choice of the substrate is dependent upon the use to which the board is to be put.

In preparing rigid metal-clad boards, a previously prepared, thermoset plastic base, such as one formed of epoxy or modified polystyrene may be used. Alternately, the thermoset plastic base may comprise a number of plies of a reinforcement, such as paper or glass cloth, impregnated with a resin in the B-stage, commonly called pre-pregs. In either case, a metallic foil, such as copper, treated on one side to adhere to the thermoset plastic base, and sometimes coated with a layer of B-stage adhesive, is placed on top of the thermoset plastic base in a high pressure press, and the composite heated under pressure to effect a bond between the metal foil and plastic substrate. When a separate B-stage adhesive is not used, the resin of the resinous substrate adjacent the metal foil, acts as the adhesive. In the case of the pre-preg, the procedure also effects a cure of the substrate in the same process. If the copper foil has been subjected to a surface treatment involving a micro-roughening and controlled oxidation of the surface, an industry-wide practice developed by me, a separate adhesive layer may frequently be omitted. In such a case, the top layer of resin in the base acts as the bonding adhesive to the copper foil.

The curing cycle in the press will depend on the nature and thickness of the laminate, the time and temperature of the cycle being those required to cure the substrate and the bonding adhesive layer, if present. Sufficient pressure is required to effect adequate flow of the adhesive and/or substrate resins, in order to wet out and bond adequately. The pressure must also be sufficient to prevent blistering which is due to the release of gases resulting either from retained volatiles in the substrate or adhesive layers or resulting from byproducts of the curing process. Such byproducts may include water, carbon dioxide, and the like.

In press-curing, especially with large presses and with multiple openings, the pressure is not uniform over the entire area of the laminate due to platen deflection, and the like, and the cured laminate in turn is not homogenous in its properties. In an autoclave, on the other hand, the pressure is uniform throughout the chamber on all areas of the laminate in all directions.

When forming metal-resin laminates in long lengths, the high pressure press cannot be employed. Prior techniques for curing long lengths of flexible metal-clad resinous plastic substrates have included merely passing the resinous plastic lamina and metal foil through a nip roll, or carrying the resinous plastic substrate metal foil laminate which has been previously nip rolled through a long oven so that heat was applied for a considerable period of time. Neither of these techniques has proven effective. In the case of nip roll bonding alone, the bond is inferior, particularly at elevated temperatures such as is experienced in subsequent soldering operations, so that there is considerable solder blistering, i.e., blistering between the metal foil and plastic substrate, when the laminate is soldered. In passing the laminate through a long oven, the foil is generally imperfectly bonded to the resinous substrate because of the expansion and escape of residual volatiles in the resin, either the resin in the substrate or in the adhesive and, in addition, the metal-clad substrate is subject to severe mechanical damage, including dents, scratches and the like. Processing in a long oven of this type is, further, uneconomical because of the time that the laminate must be subjected to heat in the oven.

SUMMARY OF THE INVENTION

In accordance with the present invention, a process has been developed for preparing useful metal-clad boards, inter alia, for use in the fabrication of printed circuits. The metal-clad boards comprise a resinous plastic substrate bonded, on one or both sides, to a metallic foil. The process is applicable to the production of rigid metal-clad boards or laminates and to the preparation of long lengths of flexible metal-plastic laminates where the resinous substrate is a flexible material such as paper, woven glass cloth, or nonwoven glass cloth impregnated with a resin which, upon curing, is flexible.

The resins which can be employed for impregnation of paper or glass cloth in forming the flexible substrate in accordance with the present invention are generally well known. They include resinous materials which, upon curing, remain flexible and have good electrical insulating properties. Suitable materials have been described in the prior art. Similarly, materials to be employed as the substrate in a rigid metal-clad board are known and have been described in the prior art.

In accordance with the present invention, in forming a flexible metal-plastic laminate, a resinous plastic substrate, preferably a woven glass fabric impregnated with a resin which, upon curing, remains flexible, is placed in contact with an electrically conductive metal foil. The resin employed is preferably one which cures at a high temperature, generally above 250° F. Such materials provide improved properties. Though the foil is preferably copper from the standpoint of end utilization, it can also be stainless steel, aluminum, Nichrome, or the like. Preferably, the metal foil is pretreated on the side which will be bonded to the resinous plastic substrate in order to improve the adhesion. The treatment may involve a surface modification of the metal foil or it may involve the application of a thin layer of adhesive, preferably a B-stage resin. Again, this resin is generally one which requires a curing temperature above 250° F. The two treatments may be combined for adherence. The resinous plastic substrate and treated metal foil are then preliminarily bonded, as by carrying them through a nip roll where the roll on the side of the metal foil is heated. Other means of accomplishing the preliminary bond include a knife over roll or squeegee combination. The contact time, pressure, and temperature are sufficient to assure that the adhesive coating on the metal foil or the adjoined resin layer of the substrate is molten so that the metal foil is thoroughly wetted with an adhesive resinous layer. This also assures the substantial absence of air between the metal foil and the resinous substrate.

When a metal foil is to be applied to both sides of the substrate, the first step of the process is as just defined, i.e., a treated metal foil is preliminarily bonded to the resinous plastic substrate, as by passing the two through a heated nip roll. A second metal foil can similarly be bonded to the opposite side of the resinous plastic substrate as by employing a second nip roll with the heated roll, again, being adjacent the metal foil to now be bonded. The conditions are the same. If desired, the metal foil on the opposite side of the resinous plastic substrate can be bonded to the substrate by a second pass through the original nip roll.

After the resinous plastic substrate and one or more metal foils have been preliminarily bonded, further processing is carried out according to the present invention. In a preferred application, a length of the preliminarily bonded metal foil-resinous plastic substrate lamina, generally from about 100 to 1,000 running feet, is wound about a mandrel. When the metallic foil is applied to only one side of the resinous plastic substrate, care must be taken to make certain that the metal foil does not fuse to the uncoated side of the adjacent resinous plastic sub-substrate. One method of preventing fusion known to art is to include a slip sheet of silicone coated paper, or the like, between adjacent lamina.

The mandrel, with the wrapped length of preliminarily bonded metal-plastic laminate is then placed within an autoclave where it is heated under pressure for a time sufficient to heat the entire roll and to complete the cure of any uncured or partially cured resin present, particularly the resin which acts to bond and adhere the metal foil to the substrate. Generally, this requires from about five to eight hours at a temperature of approximately 250° F to 400° F, the exact temperature being dependent upon the particular resin employed. The pressure within the autoclave should be from approximately 20 to 250 psi and, in any event, substantially greater than the total vapor pressure of any residual solvent, the volatile components of the resinous material, and the gaseous products of polymerization and decomposition of the resinous plastic substrate and adhesive. Unless the gas pressure in the autoclave is greater, blistering will take place between the metal foil and the resinous substrate, because the foil and substrate are impervious or substantially impervious to gas. Preferably, particularly when copper is the metallic foil, the heating should be carried out in the presence of inert gas in order to minimize oxidation of the copper foil layer. Followimg the completion of cure, the contents of the autoclave are allowed to cool to room temperature before removal. The cooling, when copper is the metallic foil, should also be carried out in the presence of an inert gas, again to minimize oxidation.

Printed circuit boards formed according to the process of the present invention have improved bond strength, improved solder blister resistance, improved dimensional stability, lower sensitivity to moisture, and improved resistance to solvents. For example, the dimensional stability is less than 0.2 mil per inch, one reason being that the laminate is not in contact with steel in the autoclave, during heating and cooling, which would lead to differential expansion. Each of these properties is generally important in a metal foil-resinous plastic laminate, but particularly so when the laminate is to be used for printed circuits. The process described in this invention, unlike the processes of the prior art, is applicable to both flexible materials which can be wound on a mandrel and to rigid materials which cannot be wound on a mandrel.

In the preparation of rigid metal clad laminates or boards, mandrels cannot be used. Instead, according to one embodiment of the present invention, separate sheets of rigid resinous substrate are fed, simultaneously with a pre-treated sheet of copper foil, through a heated nip roll to produce a preliminary bonded laminate metal-clad on one side. The procedure may be repeated with a second sheet of pre-treated copper foil on the opposite side of the resinous substrate to yield a preliminary bonded laminate metal-clad on both sides. A stack of up to several hundred preliminarily bonded laminates are placed in an autoclave for final curing, as above.

In a second embodiment according to the present invention, using a resinous substrate, which in an uncured or partially cured state is flexible, but which in a fully cured state is rigid, a continuous length of pre-treated copper foil is preliminarily bonded to a length of the uncured or partially cured resinous substrate, cut into pieces of appropriate length, e.g., 36 inches to 48 inches long, and a stack of cut pieces of such preliminarily bonded laminates is placed in an autoclave for final cure.

The processes of the prior art cannot produce the superior materials produced by the process of this invention for both types of laminated materials.

The present invention allows for extended time at temperature and pressure for completion of full cure without sacrifice of production rate. Thus, improved properties are obtained at lower cost. By comparison with the presses of the prior art, and thus associated required equipment, such as press and caul plates, an autoclave and a means for preliminary bonding, such as a nip roll, are much less expensive for comparable production rates. In addition, because processing in an autoclave follows Pascal's Law, the pressure is uniform and equal in all directions. Therefore, the pressure applied to the adhesive at the interface between the metal foil and resinous substrate is the same as that applied to the edges of the resinous substrate and to exposed faces of the laminate. This prevents the squeeze out of resin which results from the prior art use of presses. This requires the trimming of the edges of the press-formed laminates, resulting in a substantial loss of material which is substantially eliminated with the present process.

BRIEF DESCRIPTION OF THE DRAWINGS

In the accompanying drawings:

FIG. 1 is a view showing the nip roll bonding of a resinous plastic substrate to two metal foil layers;

FIG. 2 is a view of the metal foil-resinous plastic laminate being rolled onto a mandrel;

FIG. 3 is a representation of a roll of the metal foil-resinous plastic laminate on a mandrel within an autoclave; and FIG. 4 is a view showing the bonding, in a nip roll, of a single metal foil layer to a resinous plastic substrate.

DESCRIPTION OF THE PREFERRED EMBODIMENTS

In accordance with the present invention, a metal foil-resinous plastic laminate is formed with a preferred series of steps in order to firmly bond the metal foil to the resinous plastic, without blistering or other substantial defects in the bonded metal foil. The steps include the following:

1. Preparing a resinous plastic substrate.
2. Preparing a metal foil for bonding the resinous plastic substrate.
3. Preliminarily joining the metal foil to the resinous plastic substrate preferably employing a high temperature curing adhesive, which may be a B-stage resin.
4. Optionally, a repeat of steps 2 and 3 to preliminarily bond a metal foil to the opposite side of the resinous plastic substrate.

The process through step 4 is the same whether it is employed for flexible or rigid laminates. For flexible laminates, the remaining steps of the process are:

a. Wrapping the laminate formed by bonding of the metal foil or foils to the resinous plastic substrate about a mandrel.

b. Placing the mandrel with the rolled laminate in an autoclave.

c. Heating the metal foil-resinous plastic laminate rolled about the mandrel, under pressure within the autoclave.

For rigid laminates, the remaining steps of the process are:

a'. Cutting the laminates, if required, to the proper length.

b'. Placing a stack of laminate sheets of appropriate size in an autoclave.

c'. Heating the stack of laminate sheets under pressure within the autoclave.

The resinous plastic substrate can take a variety of forms. As indicated previously, the present process is adaptable to the formation of rigid metal-clad boards. For rigid metal-clad boards, the process of the present invention is an economical substitute for curing the materials in a press. Further, the present process is applicable to the formation of flexible laminates for printed circuits where the substrate is a material such as Mylar, polyethylene-terephthalate, which is not reinforced. Preferably, however, for flexible laminates the resinous plastic substrate which is used in the present process is one formed by impregnating a paper or fabric with a resinous material, which, upon being fully cured, remains flexible.

Of course, when the laminate is to be employed in the fabrication of printed circuits, it is important that the resinous plastic substrate be electrically insulating. Thus, the resin chosen for this substrate must have good electrical insulating properties. Materials which combine the properties of flexibility upon cure and electrical insulation are known in the art and are disclosed, for example, in various prior art patents. Examples of suitable resinous materials are epoxy resins, polyester resins, hydrocarbons, halohydrocarbons, or blends of these with or without other materials added.

Among the useful materials for impregnation of the paper or fabric is that disclosed in U.S. Pat. No. 3,027,279. As described in that patent, which is herein incorporated by reference, the resin has two essential components, the first of which is a branched-chain, acid-terminated polyester of dicarboxylic acid, dihydroxy alcohol, and either a polyhydric alcohol having at least three nontertiary hydroxyl groups or a polybasic acid having at least three carboxyl groups. The second essential component is an epoxy compound having at least 1.3 groups which are readily reactive with the carboxyl group, at least one of these groups being the oxirane group, where the groups are separated by a chain of at least two carbon atoms and the chain is free of ethylenic unsaturation.

The disclosure of U.S. Pat. No. 3,340,212 modified that of the '3027279 patent in disclosing a particular catalyst for the resin of the '3027279 patent. In particular, the catalyst is a stannous soap of saturated aliphatic acids having from about 4 to 12 carbon atoms and this modification of the '3027279 patent is also useful in practicing the process of the present invention.

A further resin useful in practice of the process of the present invention is shown in U.S. Pat. No. 3,525,779. This patent described a composition comprising an epoxy resin, a modifier which is the adduct of a polyol and an isocyanate, where the adduct has from 0 to 30 percent free isocyanate groups and a compound which is nonreactive with the epoxy resin and contains either a hydroxyl or a mercaptyl group in sufficient quantity to react with the free isocyanate groups. U.S. Pat. No. 3,345,429 describes a flexible, electrically insulating resin formed from a high functionality polyester and a low or intermediate functionality polyester, the two polyesters being blended together prior to curing. This material, too, can be employed in the process of the present invention.

The material which is impregnated with the flexible, electrically insulating resin can be any of those normally used for formation of such electrically insulating components. For example, the impregnated material can be glass cloth.

Various metallic foils can be used in forming the laminate according to the process of the present invention. Generally, copper, because of its conductive properties, is used. However, other electrically conducting metallic foils can be used in the process of the present invention including stainless steel, Nichrome, etc. The metal foil is prepared for bonding to the resinous plastic substrate by techniques well known in the art. According to one method, a high temperature curing adhesive is applied to the face of the metallic foil which is to be joined to the resinous plastic substrate before the two are brought into juxtaposition. The adhesive resin applied to the metallic foil can be the same as the resin used in the impregnated fabric or paper. Generally, the adhesives which can be employed include polyester-epoxy resins, vinyl epoxy resins, epoxy modified vinyl phenolic resins, and epoxy resins. One useful adhesive is formed from 150 parts polyvinyl butyral with a molecular weight of 41,000 and a butyral content of 80 percent, which can be obtained as Butvar B-90 from Monsanto Chemical Company and 100 parts of phenol formaldehyde novolak, the two being contained in a solution of 1,750 parts ethanol. The adhesive is dried at 250° for five minutes and is then cured at 350° for about five hours. A second adhesive is formed from 100 parts of Union Carbide's phenolic varnish, 100 parts nitrile rubber such as that sold by B. F. Goodrich as Hycar 1022, and methyl ethyl ketone. This material is air dried at 250° F for five minutes and then partially cured at 300° F for five minutes. Both of the adhesives are fully cured in an autoclave cycle of approximately eight hours.

The metallic foil, preferably copper, and the resin impregnated fabric or paper, can be brought together in a nip roll where pressure and temperature are applied for sufficient time to make certain that the foil is wetted with the adjacent resinous adhesive or substrate material. The two rolls of the nip roll are generally spaced such that there is approximately from two to five mils less clearance between the rolls than the uncompressed thickness of the combined foil and resinous plastic substrate.

The nip roll setting should be sufficient to accomplish preliminary bonding without wrinkling of either layer. One of the rolls is generally heated, and this is preferably placed against the copper surface. The temperature of the heated roll and the speed at which the sheets are passed between nip are related and the conditions should be such as to melt the adhesive layer so that it wets out and joins the metallic foil and layer and the resinous substrate. Generally, the speed is from about five to 10 feet per minute and the temperature from 400° F to 600° F, when employing one ounce copper. This nip rolling assures the wetting and wedding of the two layers and the exclusion of air from their interface.

The joining process just described is illustrated in FIG. 4 where a metallic foil layer 1, previously coated with an adhesive layer 7, is joined to a resinous substrate 2 by passing through the nip 3 formed by a heated roll 4 and a resilient roll 5. Upon passing through the nip, a laminate 6 is formed of the bonded metallic layer 1 and resinous plastic layer 2.

If it is desired to place a metallic foil layer on the opposite side of the resinous plastic substrate, then the process is repeated as illustrated in FIG. 1 where like parts are referred to by like numerals including metallic foil layer 1, previously treated with an adhesive layer 7, which is joined to resinous plastic layer 2 passing through nip 3 formed by heated roll 4 and resilient roll 5 to form laminate 6. A second metallic foil layer 11, prepared as described above, with an adhesive layer 27, is placed on top of laminate 6 on the side opposite first metallic foil 1. The combination of metallic foil 11 and laminate 6 is passed through nip 13 formed by heated roll 14 and resilient roll 15 to form laminate 16 having a metallic foil layer on each side of the resinous substrate.

Whether the laminate 6 of FIG. 4 having a single metallic foil, or the laminate 16 of FIG. 1 having two metallic foils, is formed, the laminate is wrapped about a mandrel 17 as shown in FIG. 2 to form a spiral roll 18 of the laminate. The size of the spiral roll is not critical and is based only on the capabilitiies of the equipment at hand. Generally, approximately 100 to 1,000 running feet of the laminate are wrapped about the mandrel 17. Useful materials for the mandrel 17 include steel, aluminum, and stainless steel.

The roll 18, preferably with the hollow mandrel 17 in the center, of the metallic foil-resinous plastic laminate is placed in an autoclave 20 as illustrated in FIG. 3 in order to complete curing of the several resinous components and to accomplish firm bonding of the resinous plastic substrate to the metallic foil. When the laminate is of the type shown as 16 in FIG. 1, no special precautions need be taken to prevent adherence of one layer to the next in the roll 18. However, when a laminate such as that shown in FIG. 4 as 6 is wrapped as roll 18, some means must be provided to prevent the metallic foil of one layer from bonding to the resinous plastic substrate of the adjacent layer. Generally, techniques are known in the art for this purpose and, for example, a slip sheet, such as a silicone-coated paper, can be placed between the various layers.

Within the autoclave the conditions are generally based upon the particular resin employed in the substrate. The purpose of the autoclaving treatment, as previously indicated, is to provide a secure, cured bond of the desired adjacent layers without blistering the metallic foil layer. Most high temperature curing resinous curing materials will generate some amount of gas, either because of the residual solvent in the resin or because of byproducts such as water or carbon dioxide, formed during the curing reaction. Thus, the pressure in the autoclave should be higher than any pressure exerted by gas components which may be generated within the autoclave. Generally, the autoclave pressure can be from about 20 to 250 psi, preferably from 75 to 250 psi, and most preferably above 150 psi.

The temperature employed in the autoclaving portion of the process should be sufficiently high to cure the resin which is employed in the adhesive or in the resinous plastic substrate, but low enough to prevent substantial degradation of the resins present. Generally, the autoclaving temperature should be in the range from about 250° F to 400° F, dependent upon the particular resinous material.

It is desirable that an inert gas be employed in the autoclaving process. If the laminate is heated in the presence of air, there is the danger of oxidizing the metallic foil, particularly copper. The inert gas employed can be nitrogen, burned gas, carbon dioxide, etc. Should there be no concern with oxidation of the metallic foil, as when stainless steel is that foil, then air, of course, can be employed.

The time of autoclaving should be sufficient to allow for diffusion of the heat through the roll 18 to obtain the desired curing temperature throughout the roll and to allow for adequate curing of the resinous materials in the roll. Generally, with a 400 running foot roll, a time of from about five to ten hours is sufficient.

In order that those skilled in the art may be better enabled to practice the process of the present invention, the following examples are given by way of illustration and not by way of limitation:

EXAMPLE 1

A resinous, reinforced plastic substrate is formed with a solution of the resin of Example 7 of U.S. Pat. No. 3,027,279 and a glass cloth. Curing the resin is as set forth in the referenced example. A length of 0.001 inch thick copper foil is coated with a sufficient amount of the same resin to form a one mil thick dry film and the resin is partially cured. The resinous plastic substrate and prepared copper foil are passed through a nip roll with a clearance approximately three mils less than the combined thickness of the resinous plastic substrate, adhesive, and metal foil at a speed of approximately seven feet per minute and a temperature of approximately 500° F. Three hundred running feet of the formed laminate are wrapped about an aluminum mandrel with a six inch diameter, silicone treated paper being interleaved between the layers. The mandrel, with the laminate spiral wrapped upon it, is placed in an autoclave at a temperature of about 350° F and a pressure of approximately 200 psi, generated by nitrogen, for approximately nine hours. When the roll is removed from the cooled autoclave and unwrapped from the mandrel, the laminate is found to be well bonded, essentially dimensionally stable, resistant to organic solvents such as toluene, and has a metallic foil surface which is generally blister free with excellent resistance to blistering on immersion in molten solder.

EXAMPLE 2

The process of Example 1 is repeated except that a second copper foil is preliminarily bonded to the opposite side of the resinous plastic substrate before the laminate is wrapped about the mandrel. The silicone treated paper is not used. The resulting laminate, after autoclaving, has essentially the same properties as indicated in Example 1.

EXAMPLE 3

The procedure of Example 2 is followed employing the resin of Example 8 of U.S. Pat. No. 3,027,279. Essentially the same results are achieved in the completed laminate.

EXAMPLE 4

A resinous, reenforced plastic substrate of grade G-10 type (NEMA grade) is formed by saturating a glass cloth with a solution of Shell Epon 1001, an epoxy resin with an average molecular weight of 900 and an epoxy equivalent of 450 to 525, which is solid at 25° C, where the epoxy resin contains 0.2 part per hundred parts of benzylidimethylamine and from two to three parts per hundred parts of dicyandiamide curing agents. The impregnated cloth is force dried and is then heated to produce a B-stage prepreg. A length of 0.0014 inch thick copper foil is coated with a one mil dry film thickness of a modified epoxy adhesive comprising 80 percent of the same Epon 1001 and 20 percent of a flexible Shell Epon 872, an adduct of an epoxy resin and a carboxylic acid with a linear structure and an epoxy content of 650 to 750 as described in U.S. Pat. No. 2,970,983. The adhesive also contains a dicyandiamide curing agent and the adhesive coating is partially cured. Lengths of the resinous plastic substrate and prepared copper foil are passed through a nip roll at a speed of approximately five feet per minute at a temperature of approximately 500° F. The process is repeated with a second, similarly prepared length of copper foil to preliminarily bond this second length of copper foil to the opposite side of the resinous plastic substrate. A running length of approximately 350 feet of the formed laminate is wrapped about a steel mandrel with a 36 inch diameter and the resulting roll is placed in an autoclave where the laminate is cured at a temperature of 325° F and a pressure of 175 psi for approximately eight hours. The roll is removed after cooling and the thus produced laminate is found to be well bonded with peel strength greater than ten pounds per inch of width, with improved dimensional stability, and with excellent resistance to blistering on immersion in molten solder. This laminate is of the semirigid type.

EXAMPLE 5

An inexpensive, rigid plastic substrate is prepared by curing a modified, isophthalic acid, maleic acid, and propylene glycol resin cross-linked with styrene containing mineral fillers such as clay, antimony oxide, and bromine compounds in a thickness of 1/16 inch. A sheet of the rigid plastic substrate is preliminarily bonded to a sheet of copper foil coated with the modified epoxy adhesive of Example 4 by passing the two sheets through a nip roll at a speed of five feet per minute and a temperature of 500° F. One hundred such preliminarily bonded copper-clad rigid boards, approximately 24 by 48 inches, are placed in an autoclave and cured at a temperature of 375° F and a pressure of approximately 200 psi for ten hours. On cooling, the stack of clad boards is removed from the autoclave and the laminates are found to be well bonded, with excellent peel strength, and excellent solder blister resistance.

As can be seen in Example 5, processing according to the present invention can be carried out on rigid metal-clad boards, as well as on flexible and semirigid metal-plastic laminates. Rather than being wrapped about a mandrel, such boards are stacked for further processing in the autoclave.

While specific examples of the process of the present invention have been shown and described, the invention should not be considered as limited to these examples, but only as limited by the appended claims.

I claim:

1. A process for preparing a laminate comprising at least one metallic foil and a resinous substrate consisting essentially of:
   (a) preliminarily bonding said metal foil and resinous plastic substrate employing a meltable, curable resinous adhesive, said preliminary bonding being carried out under sufficient pressure and temperature such that the metal foil and resinous substrate are thoroughly wetted with the resinous adhesive, to form a preliminarily bonded laminate; and
   (b) heating said preliminarily bonded laminate in an autoclave for a time sufficient to complete curing and bonding, the pressure in said autoclave being greater than the total vapor pressure generated at the interface of the metal foil and resinous plastic substrate by the curing and heating of said resinous plastic substrate and resinous adhesive.

2. The process of claim 1 wherein the meltable, resinous adhesive is a B-stage resin.

3. The process of claim 1 wherein the resin plastic substrate is flexible and the preliminarily bonded foil and substrate are rolled before being placed in the autoclave.

4. The process of claim 3 wherein the roll is formed about a mandrel.

5. The process of claim 3 wherein the substrate is selected from the class consisting of paper and fabric, impregnated with a flexible, electrically insulating resin.

6. The process of claim 1 wherein the pressure within the autoclave is from 20 to 250 psi.

7. The process of claim 6 wherein the pressure within said autoclave is from 75 to 250 psi.

8. The process of claim 7 wherein the pressure within said autoclave is from 150 to 250 psi.

9. The process of claim 1 wherein the pressure within said autoclave is generated by an inert gas.

10. The process of claim 1 wherein a metallic foil is bonded to only one side of the resinous plastic substrate.

11. The process of claim 10 wherein the matallic foil is copper.

12. The process of claim 10 wherein a silicone treated paper is placed between adjacent layers of the joined metallic foil-resinous plastic substrate while wrapping said joined materials onto a mandrel.

13. The process of claim 1 wherein a metallic foil is preliminarily bonded to each side of said resinous plastic substrate, and two preliminary bonding steps are employed, one for preliminary bonding of each metallic foil layer.

14. The process of claim 13 wherein said metallic foil is copper.

15. The process of claim 1 wherein the temperature within the autoclave is sufficiently high to cure the resinous material in the substrate, but is low enough to prevent substantial degradation of said resinous material.

16. The process of claim 15 wherein the temperature is from about 250° F to 400° F.

17. The process of claim 1 wherein the resinous plastic substrate with the preliminarily bonded metal foil is placed in the autoclave as a part of a stack of such preliminarily bonded resinous plastic substrates.

18. The process of claim 17 wherein the resinous plastic substrate, upon curing, is essentially rigid.

19. The process of claim 1 wherein the preliminary bonding is carried out in a nip roll.

* * * * *